United States Patent [19]

Ohta et al.

[11] Patent Number: 4,998,821
[45] Date of Patent: Mar. 12, 1991

[54] PROJECTION APPARATUS

[75] Inventors: Masakatsu Ohta, Tokyo; Shuichi Yabu, Kawasaki; Junichi Murakami, Kamakura, all of Japan

[73] Assignee: Canon Kabushiki Kaisha, Tokyo, Japan

[21] Appl. No.: 220,440

[22] Filed: Jul. 13, 1988

Related U.S. Application Data

[63] Continuation of Ser. No. 127,594, Dec. 2, 1987, which is a continuation of Ser. No. 42,953, Apr. 27, 1987, abandoned, which is a continuation of Ser. No. 684,792, Dec. 21, 1984, abandoned.

[30] Foreign Application Priority Data

Oct. 19, 1984 [JP] Japan ................................ 59-218571
Dec. 7, 1984 [JP] Japan ................................ 59-258562

[51] Int. Cl.⁵ .......................................... G03B 27/34
[52] U.S. Cl. .................................... 353/122; 353/101
[58] Field of Search ............... 353/100, 101, 121, 122; 355/43, 44, 53, 54, 55, 56; 350/418, 419, 253

[56] References Cited

U.S. PATENT DOCUMENTS

| 3,722,996 | 3/1973 | Fox ........................................ 355/53 |
| 4,084,903 | 4/1978 | Pircher . |
| 4,420,233 | 12/1983 | Nomoto ............................. 353/122 |
| 4,496,239 | 1/1985 | Isohata .............................. 355/53 X |
| 4,690,528 | 9/1987 | Tanimoto et al. ................... 353/101 |

FOREIGN PATENT DOCUMENTS

| 0081233 | 6/1983 | European Pat. Off. . |
| 0121969 | 10/1984 | European Pat. Off. . |
| 3213239 | 11/1982 | Fed. Rep. of Germany . |
| 3122027 | 12/1982 | Fed. Rep. of Germany . |
| 2477298 | 9/1981 | France . |
| 2504696 | 10/1982 | France . |
| 8206998 | 10/1982 | France . |
| 2042197 | 9/1980 | United Kingdom . |
| 2100453 | 12/1982 | United Kingdom . |
| 2131187 | 6/1984 | United Kingdom . |

OTHER PUBLICATIONS

Fotolithografie, Berlin 1974, p. 186.

Primary Examiner—Harry N. Haroian
Attorney, Agent, or Firm—Fitzpatrick, Cella, Harper & Scinto

[57] ABSTRACT

A projection apparatus for projecting through an optical system a circuit pattern formed on a mask or reticle onto a wafer. Ambient or environment conditions of the apparatus, such as an atmospheric pressure, temperature and humidity are detected and, on the basis of the results of detection, any focus error and magnification error upon pattern projection on the wafer are corrected.

10 Claims, 4 Drawing Sheets

PROJECTION APPARATUS

This application is a continuation of application Ser. No. 127,599 filed Dec. 3, 1987, now abandoned; which was a continuation of application Ser. No. 042,953 filed Apr. 27, 1987, now abandoned; which was a continuation of application Ser. No. 684,792 filed Dec. 21, 1984, now abandoned.

BACKGROUND OF THE INVENTION

This invention relates to a projection apparatus for projecting through an optical system a pattern formed on an object onto another object, and, more particularly, to a projection apparatus for use in the manufacture of semiconductor devices such as integrated circuits (ICs), large scaled integrated circuit (LSIs) and very large scaled integrated circuits (VLSIs).

In the field of semiconductor devices, miniaturization of the circuit pattern has been promoted in order to ensure high density integration of the devices. This promotion of miniaturization has forced development of improved exposure apparatuses for exposing a wafer to the circuit pattern formed on a mask or reticle to reproduce or print the circuit pattern on the wafer. Along with this trend, projection type exposure apparatuses are becoming dominant as compared with traditional contact type or proximity type exposure apparatuses. The projection type exposure apparatuses include projection optical systems such as mirror projection systems or lens projection systems.

The lens projection type exposure apparatuses generally include automatic focusing mechanisms for automatically locating the wafer surface at the focus position of the lens system. Most of these automatic focusing mechanisms are generally arranged such that a reference plane is set at a position spaced from the end surface of the lens system through a predetermined distance, the reference plane corresponding to the focus position of the lens system, and the wafer is moved so that the wafer surface is coincident with the reference plane, whereby the wafer surface is positioned at a constant distance from the end surface of the lens system. With such arrangement, the wafer surface can be coincident with the focus position highly accurately as long as the focus position of the lens system is fixed. If, however, the focus position of the lens system displaces for any reason, it would not be possible to make the wafer surface accurately coincident with the focus position.

This will now be described in more detail. In general, the critical resolving power L of the projection type exposure apparatus can be given by:

$$L = 1.6 \lambda Fe \qquad \ldots (1)$$

where $\lambda$ is the wavelength of the exposure beam and Fe is the F-number of the projection optical system. In order to improve the resolving power L, it is required to use a shorter wavelength $\lambda$ and/or to make the F-number Fe smaller. On the other hand, the depth of focus D of the optical system is given by:

$$D = \pm \lambda Fe^2 \; (\lambda/8 \text{ standard}) \qquad \ldots (2)$$

Therefore, an increase in the resolving power L, i.e. decrease in the wavelength $\lambda$ and/or F-number, makes the depth of focus smaller. Usually the projection exposure apparatus uses a wavelength of g-line ($\lambda = 436$ nm) and an F-number of approx. 1.43. The depth of focus D in such case is only $\pm 0.9$ micron. This results in that, if, in the lens projection type exposure apparatus employing the above-described automatic focusing mechanism, the focus position of the lens system is deviated for any reason, the circuit pattern could not be accurately projected on the wafer surface.

Factors for the deviation of the focus position of the projection optical system may be (1) changes in the temperature of the air between the reticle and wafer and changes in the temperature of the glass materials in the projection optical system, (2) changes in the pressure of ambient air between the reticle and wafer and (3) changes in the humidity of the air between the reticle and wafer.

As regards the point (1), variable elements in the components of the projection optical system may be the radius of curvature of the lens surface, the distance between the lens surfaces, and the relative index of refraction defined by the air and glass material. Changes in these elements would result in deviation of the focus position of the projection optical system. Coefficiently, the temperature change among the aforementioned three factors will cause greatest amount of focus position change. Traditionally, air-conditioning means has been employed to control the temperature within the exposure apparatus and to control the environment conditions of the apparatus to thereby suppress the amount of focus position change.

On the other hand, as regards the points (2) and (3) with respect to the changes in the pressure of ambient air and the changes in the humidity of air, a careful study has been made by J. C. Owens, which is published in "Applied Optics", 1964, No. 1, and it is known that changes in the pressure or humidity of the ambient air causes changes in the index of refraction of the air. Since, in such case, the index of refraction of the glass material has not substantially been changed, the relative index of refraction at the refracting surface will be changed.

The relative index of refraction n defined by the glass material and the air can be given by:

$$n = n_G / n_A$$

where $n_G$ is the absolute index of refraction of the glass material and $n_A$ is the absolute index of refraction of the air. The index $n_A \approx 1$, so that the amount of change $\Delta n$ in the relative index of refraction n when the absolute index of refraction $n_A$ is changed by an amount $\Delta n_A$ can be given by:

$$\Delta n \approx n_G \cdot \Delta n_A$$

Usually, $n_G$ is approximately 1.5. From this, it follows:

$$\Delta n = 1.5 \, \Delta n_A$$

From the above, it is found that the change in the index of refraction of the air causes the change in the relative index of refraction of the glass material and air by an amount which is one and half times greater than the amount of change in the index of refraction of the air itself. For example, when the ambient air pressure changes through 5 mmHg, the index of refraction of the air changes approx. by $1.8 \times 10^{-6}$. This corresponds to $2.7 \times 10^{-6}$ of the relative index of refraction of the glass and air and corresponds to the focus displacement of approx. 0.5-1.5 microns (the displacement being different depending on the characteristics of the projection optical systems). Such amount of focus displacement could not be ignored in respect to the performance of the exposure apparatus, as will be apparent from the fact that the depth of focus is within a range of ±0.9 micron as described in the foregoing.

The inventors have found that, when such change actually occurs, there also occurs a magnification error in the pattern projected on the wafer surface by the projection optical system. Usually, the semiconductor device is formed by superposing different patterns on the wafer. If the magnification of pattern projection varies for different circuit patterns, it would be difficult to accurately overlay these circuit patterns on the wafer. This results in disadvantageous degradation of the reliability of the semiconductor device.

In the lens projection type exposure apparatuses, as described above, changes in the external environments such as ambient pressure, temperature, humidity, etc. cause inconveniences due to the focus error and magnification error. Traditionally, these errors are corrected by executing an exposure examination once per three days and by performing a complicated adjustment of the exposure apparatus to ensure optimum pattern writing on the wafer.

The same assignee as of the subject application filed on Dec. 8, 1983 a Japanese Patent Application No. 58-230578 in which the assignee has proposed to detect the temperature of a projection optical system and to change the distance between the projection optical system and a wafer surface in accordance with the change of the focus position of the projection optical system.

SUMMARY OF THE INVENTION

It is accordingly a primary object of the present invention to provide a projection apparatus for projecting, through an optical system, a pattern formed on a first member onto a second member, the projection apparatus being adapted to accurately project the pattern on the second member irrespective of any changes in external environments such as ambient air pressure, temperature, humidity, etc.

It is another object of the present invention to provide a projection apparatus for projecting, through an optical system, a pattern formed on a first member onto a second member, which projection apparatus is capable of accurately and constantly positioning the second member at the focus position of the optical system.

It is a further object of the present invention to provide a projection apparatus for projecting, through an optical system, a pattern formed on a first object onto a second object, which projection apparatus is capable of accurately and constantly correcting the magnification of pattern projection onto the second member.

Briefly, the projection apparatus of the present invention for projecting, through an optical system, a pattern formed on a first member onto a second member comprises first sensing means for sensing the distance between a reference point of the optical system and the second member and producing an output corresponding to the sensed distance; second sensing means for sensing ambient conditions of the optical system, the second sensing means sensing at least two of temperature, atmospheric pressure and humidity and producing an output corresponding to the sensed ambient conditions; means for detecting the amount of change of the focus position of the optical system on the basis of the output from the second sensing means; and adjusting means for adjusting the distance between the reference point of the optical system and the second member on the basis of the outputs from the first sensing means and the detecting means.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
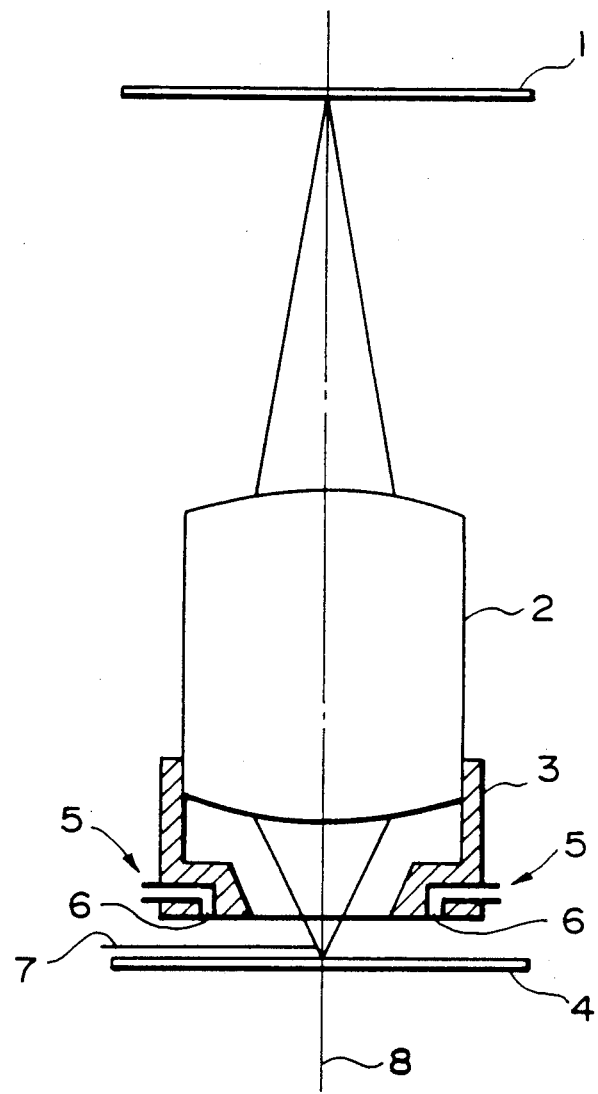
FIG. 1 is a cross-sectional view schematically showing a projection apparatus according to one embodiment of the present invention.

In the following part of this specification, preferred embodiments of the present invention will be described with reference to the drawings. In each of these embodiments, the invention is applied to a step-and-repeat type exposure apparatus for use in the manufacture of semiconductor devices such as ICs, LSIs, VLSIs, etc., in which exposure apparatus the circuit pattern formed on a reticle or mask is projected through a lens optical system onto a wafer at a reduced magnification so that the circuit pattern is printed on the wafer. In the following description particularly with reference to FIGS. 1 and 3, the direction of the optical axis of the lens projection system will be referred to as a Z-axis direction, the direction contained in a plane orthogonal to the optical axis of the projection optical system and extending horizontally as viewed in the drawing will be referred to as an X-axis direction, and the direction contained in the above-described plane and extending perpendicularly to the sheet of drawing will be referred to as a Y-axis direction, all for the sake of best understanding of the invention.

Referring first to FIG. 1 showing a projection exposure apparatus according to one embodiment of the present invention, the projection exposure apparatus includes a lens optical system 2 for projecting a circuit pattern, for the manufacture of semiconductor devices, formed on a reticle 1 onto a wafer 4 having a radiation-sensitive coating applied to the surface thereof. The lens projection optical system 2 is supported by a barrel 3. Gap sensor means 5 is provided to detect the distance between the barrel 3 and the wafer 4 surface. In accordance with an output from the gap sensor means 5, the wafer 4 moves in the Z-axis direction so that the wafer 4 surface is automatically positioned to be coincident with the focus position of the lens optical system 2. In this embodiment, the gap sensor means 5 comprises air-micrometers each of which is arranged to discharge air of a constant pressure from a nozzle and to detect the distance or gap between an object and a tip end of the nozzle on the basis of changes in the back pressure during discharge of the air. Reference numerals 6, 6 denote such tip ends of the gap sensor nozzles formed integrally with the barrel 3. A reference numeral 7 designates an origin of coordinate of the gap sensor means 5, i.e. a reference plane which is a phantom plane. A reference numeral 8 designates the optical axis of the lens projection optical system 2 which comprises a plurality of lens elements.

Figure 2:
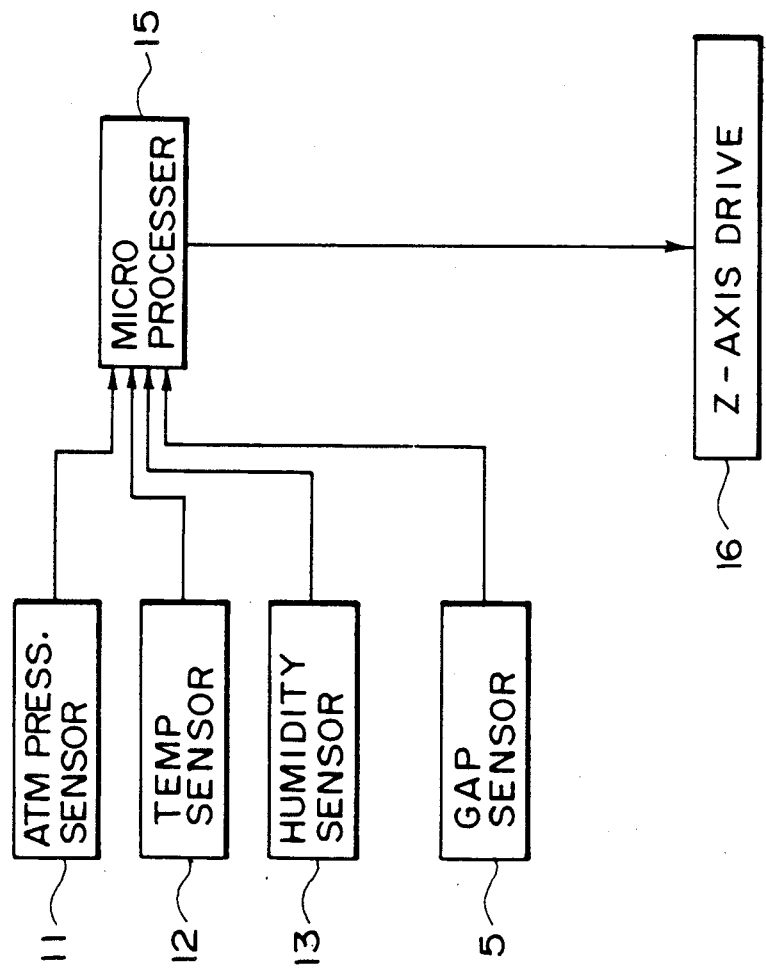
FIG. 2 is a block diagram showing an example of the control system of the projection apparatus of FIG. 1.

FIG. 2 diagrammatically shows the control system for the projection apparatus of FIG. 1. An atmospheric pressure sensor 11, a temperature sensor 12 and a humidity sensor 13 are provided to detect the environments of the apparatus of FIG. 1. Outputs from these sensors are supplied to a micro processor 15. The aforementioned gap sensor 5 also is connected to the micro processor 15. The micro processor 15 is connected to a Z-axis driving unit 16 which is arranged to drive the wafer 4 in the Z-axis direction in accordance with an output supplied thereto from the micro processor 15. The micro processor 15 is arranged to compute the amount of deviation of the focus position of the lens optical system 2 from the co-ordinate origin 7 of the gap sensor means on the basis of the outputs supplied thereto from the atmospheric pressure sensor 11, temperature sensor 12 and the humidity sensor 13, and is arranged to calculate the distance between the co-ordinate origin 7 of the gap sensor means and the wafer 4 surface on the basis of the output from the gap sensor means 5. After correcting the calculated distance by an amount corresponding to the above-described deviation, the micro processor 15 supplies the Z-axis driving unit 16 with a signal of the amount of Z-axis direction movement.

In operation, the light emitted from an unshown light source passes through the reticle 1 and enters into the lens optical system 2. By the lens optical system 2, an image of the circuit pattern of the reticle 1 is formed at the focus position of the lens optical system 2. The gap sensor means 5 senses the back pressure of the air discharged out from the tip end 6 of each air nozzle. On the basis of the sensed back pressure, the micro processor 15 calculates according to a predetermined program the distance between the co-ordinate origin 7 of the gap sensor means and the wafer 4 surface (the calculated distance being hereinafter referred to as "offset read value"), and actuates the Z-axis driving unit 16 to move the wafer 4 in the Z-axis direction so that the offset read value becomes equal to a predetermined value.

An offset value which represents the origin 7 of the co-ordinate is established in the gap sensor means 5 and is usually determined so that the focus position of the lens optical system 2 becomes coincident with the origin 7 of the gap sensor coordinate under predetermined conditions. Therefore, the surface of the wafer 4 will be normally positioned at the origin 7 of the gap sensor co-ordinate after completion of the automatic focusing.

If the focus position of the lens optical system 2 is exactly coincident with the origin 7 of the gap sensor co-ordinate, the aforementioned operation is effective to position the wafer 4 surface at the focus position of the lens optical system 2. If, however, the surrounding conditions such as ambient atmospheric pressure, temperature and humidity are changed, the focus position of the lens optical system 2 changes as described hereinbefore. Thus, in such case, the wafer 4 surface will not be coincident with the focal plane of the lens optical system 2 irrespective of the constant offset value.

In the present embodiment, the atmospheric pressure sensor 11, temperature sensor 12 and humidity sensor 13 are provided and the amount of focus deviation corresponding to the amount of changes in the atmospheric pressure, temperature and/or humidity is computed by the microprocessor 15 to correct the amount of movement of the wafer 4 in the Z-axis direction. If the amounts of focus deviation due to the changes in the atmospheric pressure, temperature and humidity are represented by $\Delta Z_P$, $\Delta Z_T$ and $\Delta Z_H$, respectively, then the combined amount of focus deviation $\Delta Z_d$ can be expressed as:

$$\Delta Z_d = \Delta Z_P + \Delta Z_T + \Delta Z_H \quad (3)$$
$$\Delta Z_P = K_1 \cdot \Delta P$$
$$\Delta Z_T = K_2 \cdot \Delta T$$
$$\Delta Z_H = K_3 \cdot \Delta H$$

where $\Delta P$, $\Delta T$ and $\Delta H$ are changes in the atmospheric pressure, temperature and humidity, respectively, and $K_1$, $K_2$ and $K_3$ are constants. While these constants $K_1$, $K_2$ and $K_3$ can be detected by calculations, they are more practically detected by experiments. Also, in the above equations, the amount of focus deviation $\Delta Z_d$ is detected by linear or first-order equations on $\Delta P$, $\Delta T$ and $\Delta H$, there may theoretically be effects of a second-order or a higher order term. However, detection by the first-order equations is sufficient since the amounts of $\Delta P$, $\Delta T$ and $\Delta H$ are actually very small.

The micro processor 15 determines a correction value relative to the offset value so as to compensate for the calculated amount of focus deviation and actuates the Z-axis driving unit 16 to cause it to move the wafer 4 in the Z-axis direction so that the offset read value becomes equal to the correction value. The offset read value as detected by the gap sensor means 5 is applied to the micro processor 15. The micro processor 15 continues to drive the Z-axis driving unit 16 until the difference between the offset read value and the correction value becomes equal to or smaller than a permissible limit value. Along this automatic focusing operation, stepwise movement of the wafer 4 in the X-axis and Y-axis directions by an unshown mechanism and reduction exposure operation of the wafer 4 to the pattern of the reticle 1 by the unshown light source are alternately repeated in the projection exposure apparatus of the present embodiment of the invention.

A projection apparatus according to another embodiment of the present invention will now be described with reference to FIGS. 3 and 4. This embodiment differs from the first-mentioned embodiment in that magnification errors as well as the focus errors are corrected in accordance with the changes in the environment conditions. In the present embodiment, elements corresponding to those of the first-mentioned embodiment are designated by the same reference numerals.

Figure 3:
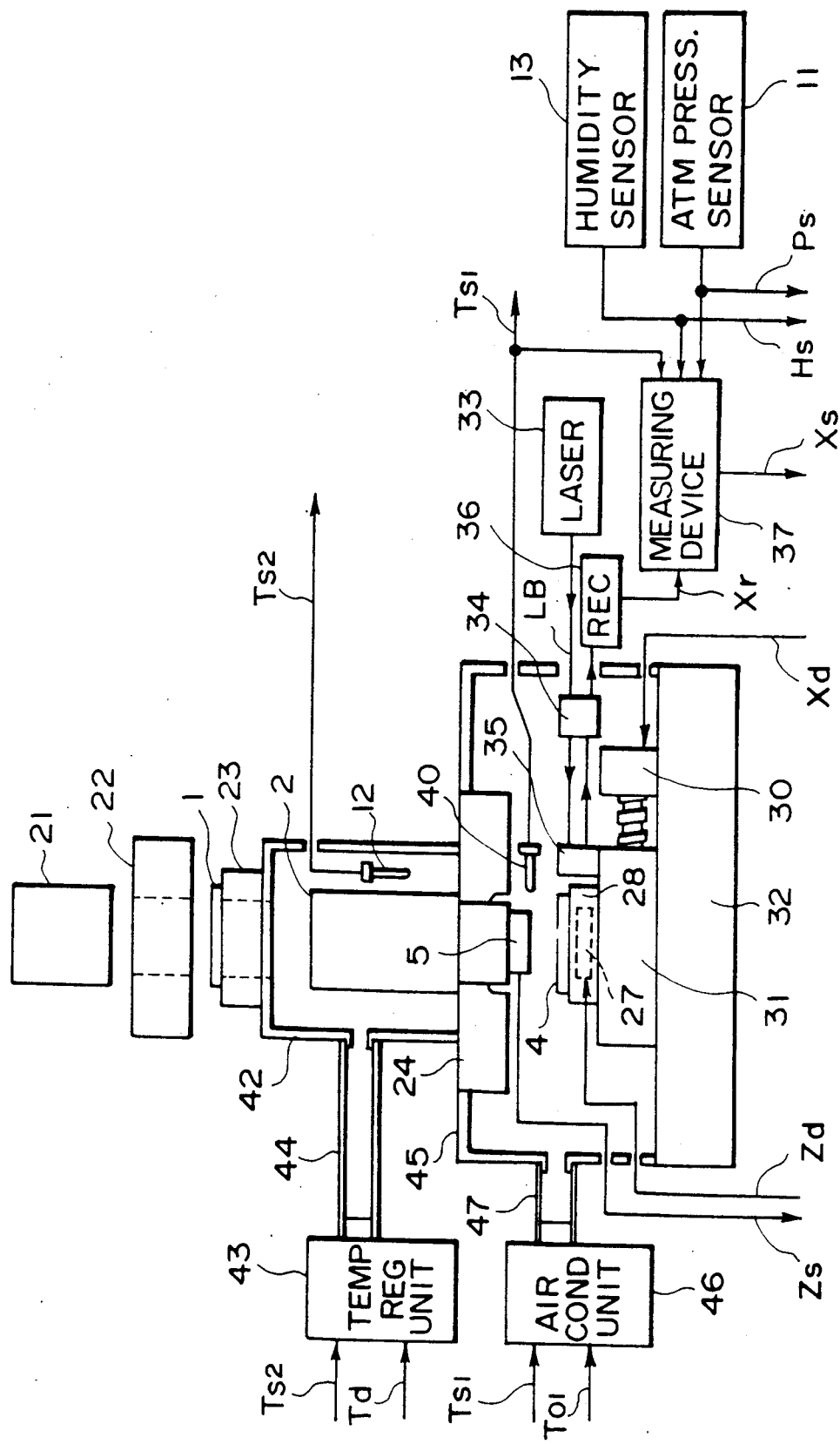
FIG. 3 is a schematic and diagrammatic view showing a projection exposure apparatus according to another embodiment of the present invention.

Referring to FIG. 3, the projection exposure apparatus includes an illuminating optical system 21 for irradiating a reticle 1 with light emitted from an unshown light source. By this irradiation, a circuit pattern formed on the reticle 1 is projected through a lens optical system 2 onto a wafer 4 at a reduced magnification so that the circuit pattern is written on the wafer 4 at the reduced magnification. The apparatus further includes an alignment scope 22 for observing relative positional deviation between the reticle 1 and the wafer 4 in an X-Y plane, a reticle stage 23 for holding the reticle 1, a supporting base 24 for supporting the lens optical system 2 through a barrel, and a wafer stage 28 for holding the wafer 4. The wafer stage 28 is provided with a piezo-electric device 27 for adjusting the position of the wafer 4 in a Z-axis direction and a $\theta$-driving unit (not shown) for adjusting the position of the wafer 4 in the $\theta$-direction which is about the optical axis (Z-axis) of the lens optical system 2. The apparatus further includes a motor 30 and an X-Y stage for carrying thereon the wafer stage 28. The position of the wafer in the X-axis direction is adjusted by the rotation of the motor 30, while the position in the Y-axis direction is adjusted by rotation of another motor (not shown in the drawing). Designated by reference numeral 32 is a base surface plate for supporting the entire apparatus.

A laser light source 33 generates a laser beam LB of a suitable wavelength which is directed to an interferometer 34 comprising an unshown beam splitter and an unshown reference reflector. Designated by reference numeral 35 is a measuring deflector fixedly secured to the X-Y stage 31; 36, is a receiver for detecting changes in the intensity of the laser beam transmitted through the interferometer 34; and 37, is a measuring device for measuring the amount of movement of the reflector 35 and thus the X-Y stage 31 in the X-axis direction on the basis of the outputs from the receiver 36, atmospheric pressure sensor 11, humidity sensor 13 and temperature sensor 40, respectively. By these elements 33-37, a known type of laser precise measurement system is provided. Although not shown in the drawing, the apparatus includes another set of laser precise measurement system for measuring the amount of movement of the X-Y stage 31 in the Y-axis direction.

The principle of the laser precise measurement will now be briefly stated. The laser beam emitted from the laser light source 33 is split into two by the beam splitter which is one component of the interferometer 34. One of the split beam is directed to the measuring reflector 35, while the other is directed to the reference reflector which is another component of the interferometer 34. These split beams, after being reflected by respective reflectors, are combined together at the beam splitter so that an interference occurs in accordance with the phase difference between the reflected beams. For every movement of the reflector 35 through a distance corresponding to a half of the wavelength of the laser beam, there occurs a phase difference of 360 degrees. Therefore, for every movement of the reflector 35 through a distance corresponding to a half of the laser beam wavelength, the intensity of the laser beam from the interferometer 34 is alternately increased and decreased. This means that a cycle of intensity change shows movement of the reflector 35 through a distance corresponding to half of the laser beam wavelength. If, therefore, the correct wavelength of the laser beam is known, it is possible to measure the amount of movement of the reflector 35 by counting through the receiver 36 the number of intensity changes.

Although the wavelength of the laser beam is unchangeable within a vacuum, it decreases in air with the increase in the index of refraction of air, the index of refraction being changeable with the changes in the temperature, atmospheric pressure and humidity. In the present embodiment, and when the amount of movement of the X-Y stage 31 is to be measured by the measuring device 37 on the basis of the product of the half wavelength of the laser beam LB with the number of intensity changes detected by the receiver 36, the value of the half wavelength of the laser beam LB set in the measuring device 37 is corrected in accordance with the amounts of deviation, from reference values, of the atmospheric pressure, humidity and temperature as detected by an atmospheric pressure sensor 11, a humidity sensor 13 and a temperature sensor 40.

A cover 42 is provided to substantially sealingly cover the space between the reticle stage 23 and the supporting base 24. The major portion of the lens optical system 2 is located in the space within the cover 42. A temperature regulating unit 43 is provided to regulate the temperature in the space as defined by the cover 42. The temperature regulating unit 43 is arranged to provide a flow of cooled or heated air through a duct 44 into the space within the cover 42 so as to maintain a desired temperature within the cover 42. A temperature sensor 12 senses the temperature within the cover 42. Another cover member 45 is provided to substantially sealingly cover the space between the supporting base 24 and the surface plate 32. In the space within the cover 45, at least a gap sensor 5, a portion of the lens optical system 2, the wafer stage 28, X-Y stage 31, motor 30, interferometer 34, measuring reflector 35 and the temperature sensor 40 are located. An air conditioning unit 46 is provided to regulate the temperature within the cover 45. Similarly to the temperature regulating unit 43, the air conditioning unit 46 is arranged to provide a flow of a cooled or heated air into the cover 45 through a duct 47.

Figure 4:
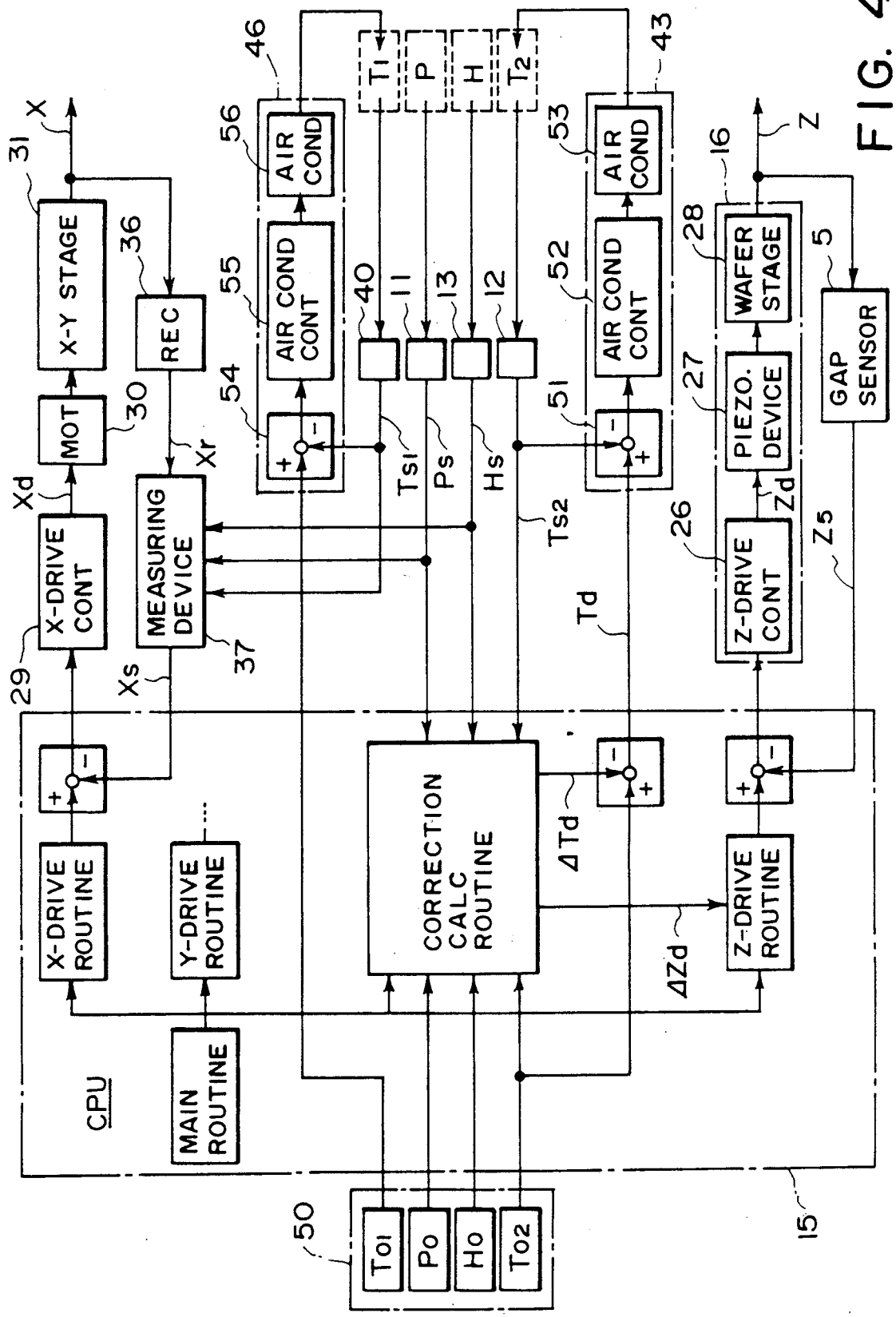
FIG. 4 is a block diagram showing an example of the control system of the projection apparatus of FIG. 3.

FIG. 4 is a diagrammatic view showing an example of the control system for the apparatus shown in FIG. 3. The system includes a micro processor 15 for controlling the operations of the apparatus with various routines set therewithin. In addition to a main routine, the microprocessor 15 has set therewithin an X-axis drive routine, a Y-axis drive routine, a Z-axis drive routine, a correction amount calculating routine, etc. which are actuated in response to instructions from the main routine. The X-axis drive routine and the Y-axis drive routine are those for controlling the position of the wafer 4 in the X-Y plane by means of the X-Y stage 31. On the other hand, the Z-axis drive routine is one for controlling the position of the wafer 4 in the Z-axis direction by means of the wafer stage 28. A reference atmospheric pressure $P_o$, a reference temperature $T_{o2}$ and a reference humidity $H_o$ are set in a reference information setting unit 50, which can be handled from the outside of the apparatus, and signals corresponding to these references are supplied to the correction calculating routine. Also, an ambient pressure P, an ambient temperature $T_2$ and an ambient humidity H are detected by the atmospheric pressure sensor 11, temperature sensor 12 and humidity sensor 13, respectively, and signals corresponding to these environment conditions are supplied to the correction calculating routine. In response to the signals corresponding to the references as supplied from the reference information setting unit 50 and to the signals corresponding to the environment conditions as supplied from the sensors 11-13, the correction calculating routine calculates an amount $\Delta Z_d$ of Z-axis drive correction and an amount $\Delta T_d$ of temperature correction, for correcting any focus errors and magnification errors which are caused by changes in the environment conditions.

The apparatus of FIG. 3 is arranged such that, when the ambient pressure P, ambient temperature $T_2$ and ambient humidity H are equal to the reference atmospheric pressure $P_o$, reference temperature $T_{o2}$ and reference humidity $H_o$, respectively, the focus position of the lens optical system 2 becomes coincident with the origin of co-ordinate of the gap sensor 5 (see FIG. 1)

and the projection magnification of the reticle 1 pattern onto the wafer 4 through the lens optical system 2 is accurately at a desired ratio, e.g. 1:5. Another reference temperature $T_{o1}$ is set in the setting unit 50 in order to designate the ambient temperature $T_1$ in the cover 4.

It will be understood from the foregoing equation (3), the amount of Z-axis drive correction $\Delta Z_d$ in the correction calculating routine of the micro processor 15 can be given by:

$$\Delta Z_d = K_1 \cdot \Delta T + K_2 \cdot \Delta P + K_3 \cdot \Delta H \quad (4)$$
$$\Delta T = T_2 - T_{o2}$$
$$\Delta P = P - P_o$$
$$\Delta H = H - H_o$$

where $\Delta T$, $\Delta P$ and $\Delta H$ are the amounts of deviation, from respective reference conditions, of the environment conditions, respectively, and $K_1$, $K_2$ and $K_3$ are constants. If the gap sensor means 5 comprises air-micrometers, these constants can be determined in view of the changes of the optical performance and the changes in the outputs of the gap sensor means 5 in accordance with the changes of the environment conditions. Actually, however, these constants will preferably be detected by experiments, as described hereinbefore.

The amount of change in the projection magnification, i.e. the magnification error $\Delta \beta$, can be detected by using $\Delta T$, $\Delta P$ and $\Delta H$ similarly to the case of $\Delta Z_d$, as follows:

$$\Delta \beta = k_1 \cdot \Delta T + k_2 \cdot \Delta P + k_3 \cdot \Delta H \quad \ldots (5)$$

Thus, the projection magnification can be maintained constant irrespective of any changes in the environments, as long as the following equation is satisfied:

$$\Delta \beta = k_1 \cdot \Delta T + k_2 \Delta P + k_3 \cdot \Delta H = 0$$

Therefore, the correction calculating routine calculates the amount of temperature correction $\Delta T_d$ in accordance with the following equation:

$$\Delta T_d = -(k_2/k_1) \cdot \Delta P - (k_3/k_1) \cdot \Delta H \quad (6)$$
$$= K_4 \cdot \Delta P + K_5 \cdot \Delta H$$
$$K_4 = -(k_2/k_1), K_5 = -(k_3/k_1)$$

where $k_1$, $k_2$ and $k_3$ are constants which are determined by the changes in the optical performance correspondingly to the changes in the environments. Similarly to the above-described constants $K_1$, $K_2$ and $K_3$, these constants $k_1$, $k_2$ and $k_3$ are preferably detected by experiments.

The amount of Z-axis drive correction $\Delta Z_d$ detected by the correction calculating routine is applied to the Z-axis drive routine. In response thereto, the Z-axis drive routine outputs an instruction signal designating a position which is displaced from the origin 7 of the gap sensor co-ordinate (see FIG. 1) in the Z-axis direction through a distance $\Delta Z_d$. On the other hand, the gap sensor 5 supplies to the micro processor 15 a signal indicative of the distance $Z_s$ from the origin 7 of the gap sensor 5 coordinate to the wafer 4 surface. The micro processor 15 compares the correction amount $\Delta Z_d$ supplied from the Z-axis drive routine and the distance $Z_s$ supplied from the gap sensor 5 and applies to a Z-axis drive control unit 26 a signal corresponding to the difference therebetween. In accordance with the difference, the Z-axis drive control unit 26 supplies to the piezo-electric device 27 a signal indicative of the amount of movement $Z_d$ for the wafer 4 to thereby move the wafer 4 on the wafer stage 28 through a distance equal to the amount $Z_d$. With this operation, the distance $Z_s$ from the origin of co-ordinate 7 to the wafer 4 surface becomes equal to the correction amount $\Delta Z_d$. When this is achieved, the Z-axis drive control unit 26 instructs to stop the movement of the wafer 4 in the Z-axis direction. By this, the wafer 4 surface is accurately aligned with the focus position of the lens optical system 2 which is determined by the current ambient temperature $T_2$, current ambient pressure $P$ and current ambient humidity $H$ within the cover 42. The Z-axis drive control unit 26, piezoelectric device 27 and the wafer stage 28 thus constitute the Z-axis drive unit 16.

On the other hand, the amount of temperature correction $\Delta T_d$ detected by the correction calculating routine is added, within the microprocessor 15, to the reference temperature $T_{o2}$ set in the setting unit 50, so that the microprocessor 15 outputs to a subtracter 51 an instructed temperature $T_d$ ($=T_{o2}+\Delta T_d$). The subtracter 51 compares the ambient temperature $T_2$ within the cover 42 as detected by the temperature sensor 12 with the instructed temperature $T_d$ and applies to an air conditioning control 52 a signal corresponding to the difference therebetween. In accordance with the signal indicative of the difference, the air conditioning control 52 controls an air conditioner 53 to cool or heat an air flow to be fed into the cover 42 through the duct 44 so that the difference between the ambient temperature $T_2$ and the instructed temperature $T_d$ becomes zero. With this operation, the temperature $T_2$ within the cover 42 becomes equal to the instructed temperature $T_d$. As a result, the magnification error of the lens projection system according to the changes in the ambient pressure $P$ and the ambient humidity $H$ is corrected. The subtracter 51, air conditioning control 52 and the air conditioner 53 thus constitute the air conditioning unit 53.

Along these error correcting operations, the apparatus of the present embodiment executes the exposure operation by projecting the circuit pattern of the reticle 1 onto the wafer 4 through the lens optical system 2. This exposure operation is repeated while stepwisely moving the wafer 4 by means of the X-Y stage 31. The X-axis drive routine and the Y-axis drive routine of the micro processor 15 are provided to control the stepwise movement of the wafer 4 which is repeated alternately with the exposure operation. Since the arrangement for the stepwise movement of the wafer 4 in the X-axis direction in accordance with the X-axis drive routine is essentially the same as that for the stepwise movement of the wafer 4 in the Y-axis direction in accordance with the Y-axis drive routine, the following description will be made only on the operation of the X-axis drive routine for the sake of simplicity of explanation.

When the exposure of a portion on the wafer 4 is completed, the X-axis drive routine instructs the amount of movement for moving the wafer 4 so that another portion of the wafer 4 is positioned in alignment with the projection region of the lens optical system 2. The micro processor 15 compares this instructed amount of movement with the actual amount of movement of the X-Y stage 31 measured by the measuring device 37 and outputs, to the X-axis drive control unit 29, a signal corresponding to the difference therebetween. In accordance with this difference, the X-axis drive control unit 29 produces a signal corresponding to a necessary amount of movement $X_d$ and applies it to the motor 30 to control the drive of the motor. By this, the wafer 4 is moved in the X-axis direction through the X-Y stage 31. As the X-Y stage 31 moves in the X-axis direction, the reflector 35 on the X-Y stage 31 moves together. For every movement of the reflector 35 through a distance corresponding to a half of the wavelength of the laser beam LB emitted from the light source 33, an interference occurs within the interferometer 34 so that the intensity of the light incident on the receiver 36 changes accordingly. Every time as the intensity change occurs, the receiver 36 outputs a detection signal $X_r$ to the measuring device 37. Then, the measuring device 37 produces a signal of the amount of movement $X_s$ which comprises the product of the number of intensity changes with the value which has been set in the measuring device 37 as the half of the wavelength of the laser beam LB. This operation is continued until the amount of movement $X_s$ indicated by the measuring device 37 becomes equal to the set amount of movement designated by the X-axis drive routine at which the output $X_d$ of the X-axis drive control unit 29 becomes equal to zero.

The wavelength of the laser beam LB is changeable with the change in the index of refraction of the air due to any changes in the environment conditions, as described hereinbefore. In view of this, the system of the present invention is arranged so that the measuring device 37 receives various information, such as the ambient temperature $T_1$ within the cover 45 from the temperature sensor 40, the ambient pressure P from the atmospheric pressure sensor 11 and the ambient humidity H from the humidity sensor 13, in order to correct the value set in the measuring device 37 as the half wavelength of the laser beam LB. The signals on the environment conditions produced by these sensors 40, 11 and 13 are supplied also to a corresponding measuring device (not shown) of the Y-axis drive routine.

A signal $T_{s1}$ corresponding to the ambient temperature $T_1$ within the cover 45 as sensed by the temperature sensor 40 is applied to a subtracter 54. The subtracter 54 compares the ambient temperature $T_1$ with the reference temperature $T_{o1}$ set in the setting unit 50 and produces a signal corresponding to the difference therebetween. This signal is applied to an air conditioning control 55 which, in accordance with the difference, controls an air conditioner 56 to cool or heat an air flow to be fed into the cover 45 through the duct 47 so that the ambient temperature $T_1$ within the cover 45 becomes equal to the reference temperature $T_{o1}$. Thus, the subtracter 54, air conditioning control 55 and the air conditioner 56 constitute the air conditioning unit 46. In the diagrammatic view of FIG. 4, reference characters $P_s$, $T_{s2}$, $H_s$, $T_{s1}$ denote the detection signals from the sensors 11, 12, 13 and 40, respectively.

The present invention is not limited to the disclosed embodiments and various modifications are possible. For example, the air-micrometers used in the disclosed embodiments as the gap sensor means may be replaced by non-contact type electric mircometers. Alternatively, a suitable optical detection system using laser beam scanning or television image processing may be employed.

While, in the foregoing embodiments, the amount of Z-axis drive correction $\Delta Z_d$ and the amount of temperature correction $\Delta T_d$ are detected by the predetermined calculations, the system may be arranged so that these correction amounts corresponding to the environment conditions such as the atmospheric pressure, temperature, humidity, etc. are preparatively stored in a memory and each correction amount is read out by using information on the environment condition.

Moreover, the present invention is not limited to the application to the semiconductor wafer exposure apparatus. For example, the present invention is applicable to other pattern transferring apparatuses such as hologram manufacturing devices, copying machines, etc.

In accordance with the present invention as has been described in the foregoing, the set position of the pattern transfer plane such as the wafer surface and/or the projection magnification are corrected in accordance with the changes in the atmospheric pressure, temperature and/or the humidity. This ensures that the pattern transfer plane can be always coincident with the focal surface of the projection optical system and the pattern can be projected on the pattern transfer surface at a correct magnification irrespective of any changes in the atmospheric pressure, temperature and/or humidity.

While the invention has been described with reference to the structures disclosed herein, it is not confined to the details set forth and this application is intended to cover such modifications or changes as may come within the purposes of the improvements or the scope of the following claims.

What is claimed is:

1. An apparatus for projecting through a lens system having a focus position, a pattern formed on a first object onto a second object, said pattern being projected at a magnification, said apparatus comprising:
   first sensing means for sensing the distance between a reference point on said lens system and the second object, and for producing an output corresponding to the sensed distance;
   second sensing means for sensing ambient conditions that can change the focus position of said lens system, and for producing an output corresponding to the sensed ambient conditions, said second sensing means sensing the ambient temperature, ambient gas pressure, and humidity;
   means for detecting the amount of change of the focus position of said lens system on the basis of the output from said second sensing means;
   adjusting means for adjusting the distance between the reference point on said lens system and the second object on the basis of the outputs from said first sensing means and said detecting means; and
   means for maintaining the magnification of the pattern projected through said lens system at a constant value, wherein said maintaining means includes means for adjusting the ambient temperature of said lens system, which temperature adjusting means is effective to correct a magnification error caused by a change in ambient gas pressure and humidity.

2. An apparatus according to claim 1, wherein said lens system includes a plurality of lens components.

3. An apparatus for projecting through a projection lens system, a pattern formed on a first object onto a second object that is located at a position relative to said projection lens system, said apparatus comprising:
   first sensing means for sensing the positional relation between said projection lens system and the second object in the direction of the optical axis of said projection lens system;

second sensing means for sensing by optical interference the positional relation between said projection lens system and the second object in a plane perpendicular to the optical axis of said projection lens system;

third sensing means for sensing ambient conditions that can change the positional relation between said projection lens system and the second object, including a first temperature sensor for sensing the ambient temperature proximate to said projection lens system, a second temperature sensor for sensing the ambient temperature proximate to the second object, an ambient gas pressure sensor, and a humidity sensor;

first adjusting means for adjusting the positional relation between said projection lens system and the second object in the direction of the optical axis of said projection lens system, said first adjusting means being controllable on the basis of outputs produced by said first and third sensing means; and second adjusting means for adjusting the positional relation between said projection lens system and the second object in the plane perpendicular to the optical axis of said projection lens system, said second adjusting means being controllable on the basis of outputs produced by said second and third sensing means.

4. An apparatus according to claim 3, wherein outputs of said first temperature sensor, said ambient gas pressure sensor and said humidity sensor are used in combination to control said first adjusting means, while outputs of said second temperature sensor, said ambient gas pressure sensor and said humidity sensor are used in combination to control said second adjusting means.

5. An apparatus according to claim 1, wherein said correcting means is adapted to change the ambient conditions of said optical system on the basis of the output from said third sensing means to correct the magnification error.

6. An apparatus according to claim 5, wherein said correcting means includes temperature regulating means for adjusting the ambient temperature of said optical system.

7. An apparatus according to claim 6, wherein said third sensing means includes a temperature sensor for sensing the temperature adjusted by said temperature regulating means, an ambient gas pressure sensor and a humidity sensor.

8. An apparatus according to claim 7, wherein outputs of said temperature sensor, said ambient gas pressure sensor and said humidity sensor are used in combination to control said first adjusting means.

9. An apparatus for projecting through an optical system a pattern formed on a first object onto a second object that is located at a position relative to the optical system, said pattern being projected at a desired magnification, said apparatus comprising:

first sensing means for sensing the positional relation between said optical system and the second object in the direction of the optical axis of said optical system;

second sensing means for sensing the positional relation between said optical system and the second object in a plane perpendicular to the optical axis of said optical system;

third sensing means for sensing ambient conditions that can change the positional relation between an image plane of said optical system and the second object;

first adjusting means for adjusting the positional relation between the image plane of said optical system and the second object in the direction of the optical axis of said optical system, said first adjusting means being controllable on the basis of the outputs produced by said first and third sensing means;

second adjusting means for adjusting the positional relation between said optical system and the second object in the plane perpendicular to the optical axis of said optical system, said second adjusting means being controllable on the basis of outputs produced by said second and third sensing means; and correcting means for correcting an error in the magnification, relative to the desired magnification, of the pattern projected through said optical system.

10. An apparatus for projecting an image of a pattern of a first object onto a second object, said apparatus comprising:

a projection lens system having a focus position for projecting at a magnification the image of the pattern of the first object onto the second object, said projection lens system being contained in a gaseous environment and spaced apart from the second object;

sensing means for sensing a change in the gas pressure of the gaseous environment;

first adjusting means for controlling the temperature of the gaseous environment on the basis of the sensing by said sensing means so as to maintain the magnification of said projection lens system substantially constant irrespective of any change in the gas pressure of the gaseous environment;

second adjusting means for adjusting the spacing between the second object and said projection lens system on the basis of the sensing by said sensing means, so as to compensate for a change in the focus position of said projection lens system, in relation to the second object, due to a change in the gas pressure of the gaseous environment;

said sensing means is further adapted to sense a change in the temperature of the gaseous environment, as well as a change in the gas pressure of the gaseous environment; and said second adjusting means is responsive to the sensing by said sensing means to compensate for a change in the focus position of said projection lens system, in relation to the second object, due to a change in the temperature of the gaseous environment.

* * * * *

UNITED STATES PATENT AND TRADEMARK OFFICE
CERTIFICATE OF CORRECTION

PATENT NO. : 4,998,821
DATED : March 12, 1991
INVENTOR(S) : MASAKATSU OHTA, ET AL.

It is certified that error appears in the above-identified patent and that said Letters Patent is hereby corrected as shown below:

On the title page:

IN [63] RELATED U.S. APPLICATION DATA

"Ser. No. 127,594" should read --Ser. No. 127,599--.

COLUMN 1

Line 67, "Usually" should read --Usually,--.

COLUMN 6

Line 39, "Along" should read --During--.

COLUMN 7

Line 6, "X-Y stage" should read --X-Y stage 31--.
Line 35, "beam" should read --beams--.

COLUMN 9

Line 5, "cover 4." should read --cover 42.--.

COLUMN 10

Line 39, "air conditioning unit 53." should read --air conditioning unit 43.--.
Line 40, "Along" should read --During--.
Line 44, "stepwisely" should read --stepwise--.

UNITED STATES PATENT AND TRADEMARK OFFICE
CERTIFICATE OF CORRECTION

PATENT NO. : 4,998,821

DATED : March 12, 1991

INVENTOR(S) : MASAKATSU OHTA, ET AL.

Page 2 of 2

It is certified that error appears in the above-identified patent and that said Letters Patent is hereby corrected as shown below:

COLUMN 13

Line 36, "claim 1," should read --claim 9,--.

Signed and Sealed this

Twenty-second Day of December, 1992

Attest:

DOUGLAS B. COMER

Attesting Officer

Acting Commissioner of Patents and Trademarks